US007563718B2

(12) United States Patent
Kim

(10) Patent No.: US 7,563,718 B2
(45) Date of Patent: Jul. 21, 2009

(54) METHOD FOR FORMING TUNGSTEN LAYER OF SEMICONDUCTOR DEVICE AND METHOD FOR FORMING TUNGSTEN WIRING LAYER USING THE SAME

(75) Inventor: Choon Hwan Kim, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 148 days.

(21) Appl. No.: 11/618,631

(22) Filed: Dec. 29, 2006

(65) Prior Publication Data

US 2008/0003797 A1 Jan. 3, 2008

(30) Foreign Application Priority Data

Jun. 29, 2006 (KR) .................... 10-2006-0059925

(51) Int. Cl.
*H01L 21/4763* (2006.01)
(52) U.S. Cl. .................. 438/693; 438/627; 438/643; 438/680; 438/687; 438/798; 257/E21.171; 257/E21.269; 257/E21.279; 257/E21.586; 257/E21.589; 257/E23.145; 257/E23.162; 257/E23.167; 257/E29.157
(58) Field of Classification Search ................ 438/656, 438/474, 627, 643, 680, 685, 687, 798; 257/E21.171, 257/269, 279, 281, 283, 293, 586, 589, 627, 257/641, E23.145, 162, 167, E29.157
See application file for complete search history.

(56) References Cited

U.S. PATENT DOCUMENTS 6,156,382 A * 12/2000 Rajagopalan et al. ....... 427/250
6,251,190 B1 * 6/2001 Mak et al. ................... 118/715
6,544,889 B2 4/2003 Vercammen et al.
6,727,169 B1 * 4/2004 Raaijmakers et al. ....... 438/622
6,787,461 B2 9/2004 Wang et al.
6,905,543 B1 * 6/2005 Fair et al. ...................... 117/89
6,933,225 B2 * 8/2005 Werkhoven et al. ......... 438/627
6,986,914 B2 * 1/2006 Elers et al. ............. 427/255.23
7,005,372 B2 * 2/2006 Levy et al. .................. 438/627
7,419,903 B2 * 9/2008 Hakka et al. ................ 438/627
7,485,340 B2 * 2/2009 Elers et al. .................. 427/253
7,498,242 B2 * 3/2009 Kumar et al. ............... 438/474
2005/0136185 A1 * 6/2005 Ramanathan et al. ....... 427/299
2008/0045010 A1 * 2/2008 Wongsenakhum et al. .. 438/656

FOREIGN PATENT DOCUMENTS

KR   1020010012627 A   2/2001
KR   1020040001872 A   1/2004
KR   1020040003385 A   1/2004

* cited by examiner

*Primary Examiner*—Michael S Lebentritt
(74) *Attorney, Agent, or Firm*—Townsend and Townsend and Crew LLP

(57) ABSTRACT

A semiconductor substrate is loaded into a reaction chamber to form a tungsten layer. A source gas including tungsten (W) is introduced into the reaction chamber to grow a crystal nucleus of the tungsten on the semiconductor substrate. A reduction gas containing boron (B) is introduced into the reaction chamber to form a tungsten layer on the semiconductor substrate by actions of the source gas and the reduction gas. A hydrogen ($H_2$) gas is introduced into the reaction chamber to remove the boron (B) remaining in the tungsten layer.

19 Claims, 3 Drawing Sheets

METHOD FOR FORMING TUNGSTEN LAYER OF SEMICONDUCTOR DEVICE AND METHOD FOR FORMING TUNGSTEN WIRING LAYER USING THE SAME

CROSS-REFERENCES TO RELATED APPLICATIONS

The present application claims priority to Korean application number 10-2006-0059925, filed on Jun. 29, 2006, which is incorporated by reference in its entirety.

BACKGROUND OF THE INVENTION

The present invention relates to a method for fabricating a semiconductor device, and more particularly to a method for forming a tungsten layer and a method for forming a tungsten wiring layer in a semiconductor device.

The refresh function for a volatile memory device, such as a dynamic random access memory (DRAM) consumes a large amount of electric power. As a result, the refresh process can be a problem for mobile products. Consequently, this problem can be solved by increasing the refresh cycle. A possible solution for increasing the refresh cycle is to decrease parasitic capacitance (Cb) in the cell.

When the thickness of a bit line conduction layer, i.e., a tungsten layer, is reduced, the parasitic capacitance (Cb) is decreased. However, excessive thickness reduction of the bit line increases sheet resistance of the bit line, which decreases the operating speed of the semiconductor device. In order to solve this problem, research has been conducted on a process for forming a tungsten layer having low resistivity. One representative example is a method of forming a tungsten nucleation layer using a diborane ($B_2H_6$) gas. Specifically, the tungsten nucleation layer is formed by atomic layer deposition (ALD) through successive actions of the diborane ($B_2H_6$) gas and a tungsten hexafluoride ($WF_6$) gas, then the tungsten layer is deposited by hydrogen reduction. As a result, the grain number of the tungsten is increased, which decreases the scattering due to grain boundary, thus lowering the resistivity of the tungsten layer.

However, the excessive use of the diborane ($B_2H_6$) gas causes boron (B) to remain in the tungsten layer. As a result, the leakage of current is increased due to the permeation of the boron (B) into the joint area, the characteristics of the semiconductor device are deteriorated, and the yield of the semiconductor device is decreased.

SUMMARY OF THE INVENTION

Embodiments of the invention are directed to a method for forming a tungsten layer and a method for forming a tungsten wiring layer.

In one embodiment, a method for forming a tungsten layer on a semiconductor substrate includes; loading a semiconductor substrate into a reaction chamber; introducing a source gas including tungsten (W) into the reaction chamber to grow a crystal nucleus of the tungsten on the semiconductor substrate; introducing a reduction gas containing boron (B) into the reaction chamber to form a tungsten layer on the semiconductor substrate; and introducing a hydrogen ($H_2$) gas into the reaction chamber to remove the boron (B) remaining in the tungsten layer.

The method further comprises the step of introducing a purge gas into the reaction chamber. This is carried out after the step of introducing a reduction gas containing boron (B) into the reaction chamber to form a tungsten layer on the semiconductor substrate and the step of introducing a hydrogen ($H_2$) gas into the reaction chamber.

In another embodiment, a method for forming a tungsten wiring layer of a semiconductor device includes; etching an interlayer insulation layer formed on a semiconductor substrate including a lower conduction region to form contact holes, through which the lower conduction region is partially exposed; forming a tungsten layer on the semiconductor substrate by actions of a source gas including tungsten (W) and a reduction gas containing boron (B); and exposing the semiconductor substrate to a hydrogen ($H_2$) gas to remove the boron (B) remaining in the tungsten layer.

The method further comprises the step of forming a barrier metal layer in the contact holes. This is carried out before the step of forming a tungsten layer on the semiconductor substrate.

DESCRIPTION OF SPECIFIC EMBODIMENTS

The present invention relates to a method for forming a tungsten layer and a method for forming a tungsten wiring layer of a semiconductor device in which a hydrogen gas is introduced during the depositing of a tungsten (W) layer, thereby preventing boron (B) from remaining in the deposited tungsten layer. The diffusion of the boron into the impurity regions is prevented and thus leakage current is prevented. As a result, the characteristics of the semiconductor device are improved, and the yield of the semiconductor device is increased.

Figure 1:
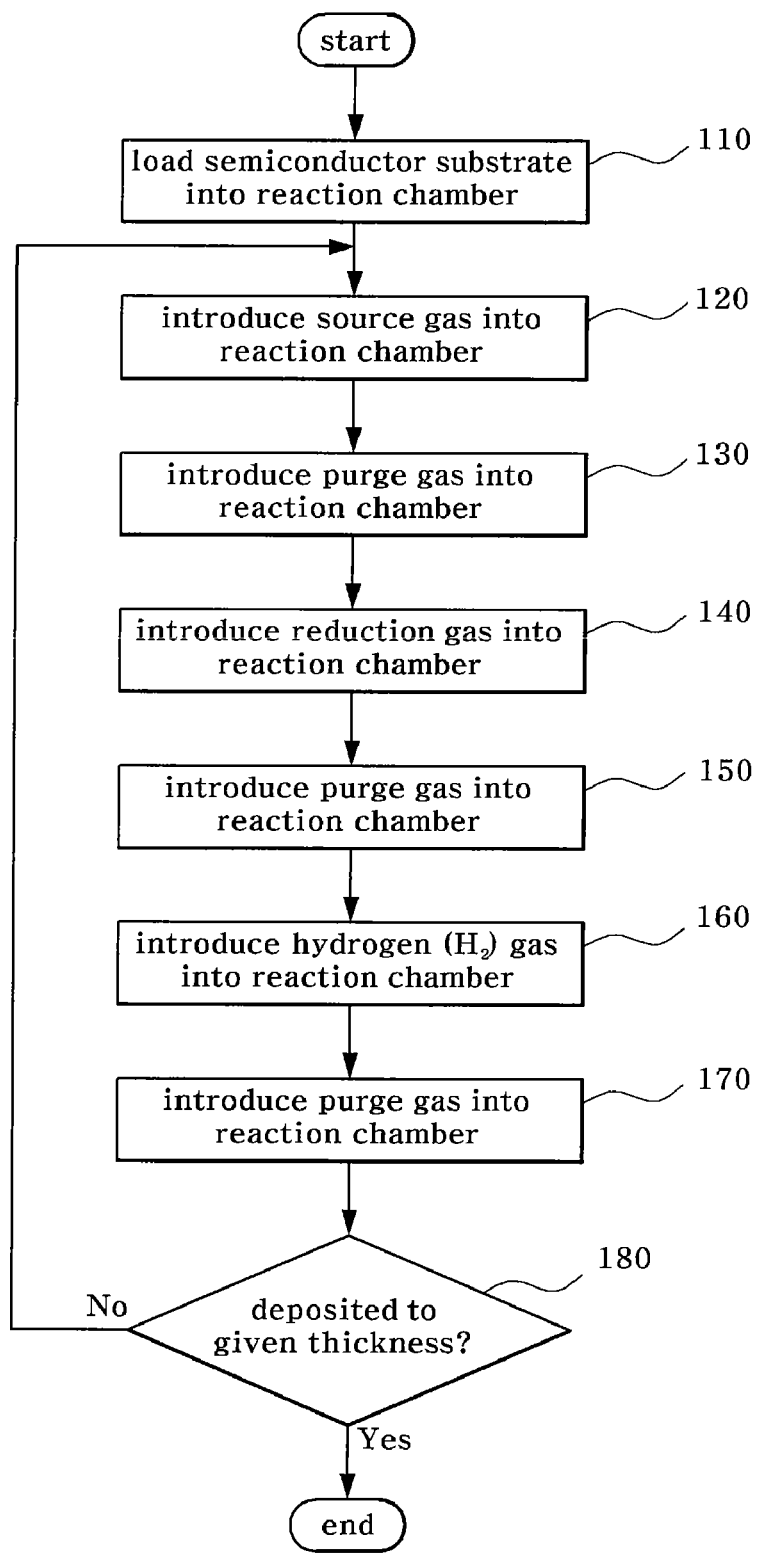
FIG. 1 is a flow chart illustrating a method for forming a tungsten layer according to the present invention.

FIG. 1 is a flow chart illustrating a method for forming a tungsten layer according to the present invention. A semiconductor substrate is loaded into a reaction chamber (not shown) (Step 110). Here, the reaction chamber is a chamber for atomic layer deposition (ALD). Some layers have already been formed on the semiconductor substrate. For example, when it is necessary to form a bit line using a tungsten layer, a transistor including a gate stack, an interlayer insulation layer, and contact holes are formed on the semiconductor substrate. A barrier metal layer may be formed in the contact holes.

A source gas including tungsten (W) is introduced into the reaction chamber such that a nucleus of the tungsten crystal grows on the semiconductor substrate (Step 120). A tungsten hexafluoride ($WF_6$) gas and a hydrogen gas are used as the source gas. A purge gas is introduced into the reaction chamber (Step 130). An inert gas is used as the purge gas.

A reduction gas containing boron (B), for example, a diborane ($B_2H_6$) gas, is introduced into the reaction chamber. As a result, a tungsten layer is formed on the semiconductor substrate by actions of the source gas and the reduction gas (Step 140). A purge gas is introduced into the reaction chamber (Step 150). An inert gas is used as the purge gas.

A hydrogen ($H_2$) gas is introduced into the reaction chamber so as to remove the boron (B) remaining in the tungsten layer (Step 160). As the hydrogen ($H_2$) gas is introduced into the reaction chamber for a few seconds, boron (B) ions remaining in the tungsten layer combine with hydrogen (H) ions, and therefore, the boron (B) is prevented from remaining in the tungsten layer. Hydrogen plasma may be formed in the reaction chamber instead of introducing the hydrogen gas into the reaction chamber. A purge gas is supplied into the reaction chamber (Step 170). An inert gas is used as the purge gas.

It is determined whether the tungsten layer has been deposited to a target thickness (Step 180). When it is determined that the tungsten layer has been deposited to the target thickness, the deposition process is terminated. If it is determined that the tungsten layer has not been deposited to the target thickness, the procedure returns to the source gas introduction step (Step 120), and the deposition process is repeatedly carried out until the tungsten layer is deposited to the target thickness.

Figure 2:
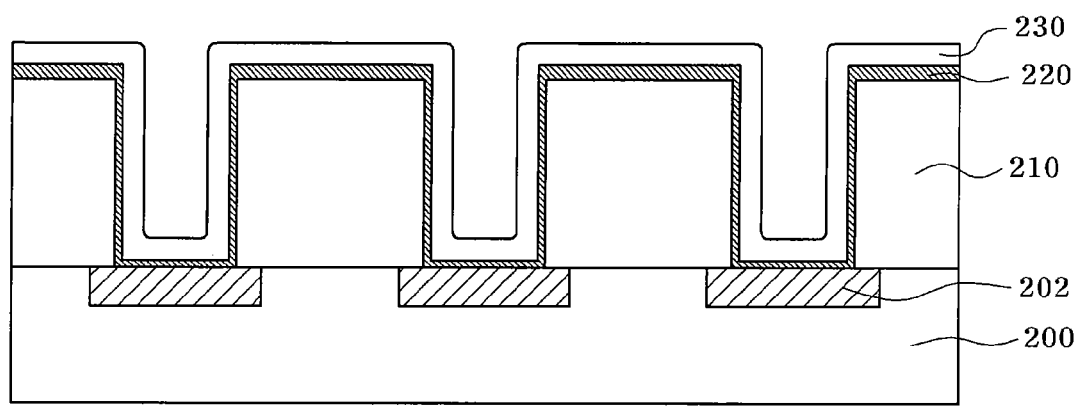
FIG. 2 a sectional view illustrating a tungsten nucleation layer formed on a semiconductor substrate.
Figure 3:
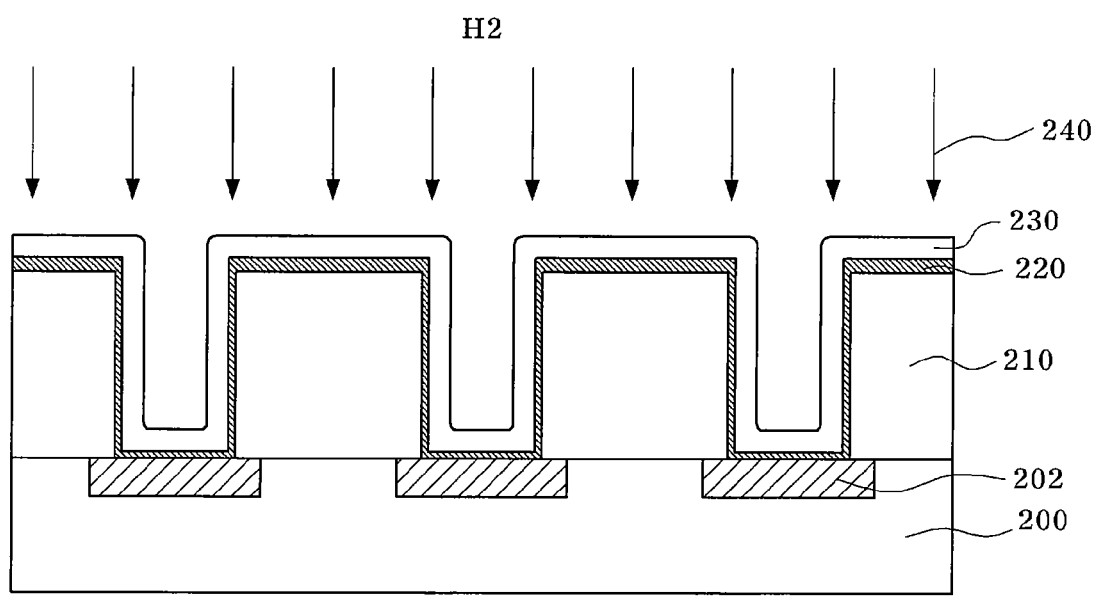
FIG. 3 is a sectional view illustrating a hydrogen gas processing step carried out to remove boron remaining in the tungsten nucleation layer.
Figure 4:
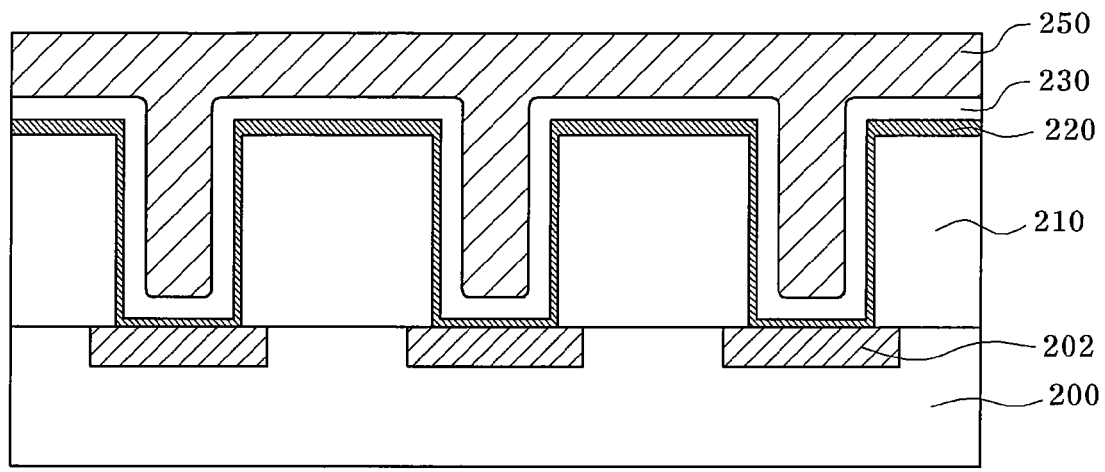
FIG. 4 is a sectional view illustrating a tungsten wiring layer formed on the tungsten nucleation layer.

FIGS. 2 to 4 are sectional views illustrating a method for forming a wiring layer of a semiconductor device using the tungsten layer forming method according to the present invention. Referring to FIG. 2, impurity ions are implanted into an active area of the semiconductor substrate 200 and the impurity ions are activated so as to form impurity regions 202. An insulation layer is deposited on the semiconductor substrate 200, in which the impurity regions 202 have been formed, so as to form an interlayer insulation layer 210. Although not shown, in the case that the tungsten wiring layer is used as a bit line conduction layer, a gate stack including a gate insulation layer, a gate conduction layer, and a hard mask layer, is formed on the semiconductor substrate before the interlayer insulation layer is formed. Also the impurity regions 202 become the transistor drains with each including the gate stack.

The interlayer insulation layer 210 is etched at given areas so as to form a contact hole through which the impurity regions 202 are exposed. A barrier metal, such as titanium (Ti) or titanium nitride (TiN), is deposited so as to form a barrier metal layer 220 on the inner walls of the contact holes. A tungsten nucleation layer 230 is formed on the barrier metal layer 220. The tungsten nucleation layer 230 is formed, for example, by atomic layer deposition (ALD). Specifically, a source gas consisting of tungsten hexafluoride ($WF_6$) and hydrogen and a diborane ($B_2H_6$) gas are introduced into the reaction chamber so as to form a tungsten nucleation layer 230 having a thickness of approximately 20 to 60 □.

Referring to FIG. 3, for a few seconds a hydrogen ($H_2$) gas is introduced to the semiconductor substrate, on which the tungsten nucleation layer 230 has been formed, in the direction indicated by arrows 240. As a result, boron (B) ions remaining in the tungsten nucleation layer 230 combine with hydrogen (H) ions, and therefore, the boron (B) is prevented from remaining in the tungsten nucleation layer 230. Even when hydrogen plasma is formed instead of introducing the hydrogen gas, the same effect is accomplished.

Referring to FIG. 4, a tungsten layer is deposited on the tungsten nucleation layer 230 to a target thickness so as to form a tungsten wiring layer 250, which fills the contact holes. Until the tungsten layer is deposited to the target thickness, a tungsten deposition process using a tungsten hexafluoride ($WF_6$) gas, a hydrogen gas, and a diborane ($B_2H_6$) gas, and a hydrogen introduction process are repeatedly carried out several times.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for forming a tungsten layer over a semiconductor substrate, the method comprising:
    loading a semiconductor substrate into a reaction chamber;
    introducing a source gas including tungsten (W) into the reaction chamber to grow a crystal nucleus of the tungsten over the semiconductor substrate;
    introducing a reduction gas containing boron (B) into the reaction chamber to form a tungsten layer over the semiconductor substrate by actions of the source gas and the reduction gas;
    introducing a hydrogen ($H_2$) gas into the reaction chamber, wherein the boron (B) remaining in the tungsten layer is combined with ionic hydrogen (H) to remove the boron (B) remaining in the tungsten layer; and
    purging the combined boron (B) and hydrogen (H).

2. The method according to claim 1, wherein the reaction chamber is a chamber configured for performing atomic layer deposition (ALD).

3. The method according to claim 1, wherein a tungsten hexafluoride ($WF_6$) gas and a hydrogen gas are used as the source gas, and a diborane ($B_2H_6$) gas is used as the reduction gas.

4. The method according to claim 1, further comprising:
    introducing a purge gas into the reaction chamber, wherein the step of introducing a purge gas into the reaction chamber is carried out after the step of introducing a reduction gas containing boron (B) into the reaction chamber to form a tungsten layer over the semiconductor substrate and the step of introducing a hydrogen ($H_2$) gas into the reaction chamber.

5. The method according to claim 1, wherein, at the step of introducing a hydrogen ($H_2$) gas into the reaction chamber, hydrogen ($H_2$) plasma is formed in the reaction chamber.

6. The method according to claim 1, wherein the step of introducing a source gas including tungsten (W) into the reaction chamber to grow a crystal nucleus of the tungsten over the semiconductor substrate, the step of introducing a reduction gas containing boron (B) into the reaction chamber to form a tungsten layer over the semiconductor substrate, and the step of introducing a hydrogen (H2) gas into the reaction chamber are repeatedly carried out several times until the tungsten layer has a target thickness.

7. A method of forming a tungsten wiring layer of a semiconductor device, the method comprising:
    etching an interlayer insulation layer formed over a semiconductor substrate including a lower conductive region to form contact holes, the contact holes partially exposing the lower conduction region;
    forming a tungsten layer over the semiconductor substrate using a reaction of a source gas including tungsten (W) and a reduction gas containing boron (B); and
    exposing the semiconductor substrate to a hydrogen ($H_2$) gas, wherein the boron (B) remaining in the tungsten layer is combined with ionic hydrogen (H) to remove the boron (B) remaining in the tungsten layer.

8. The method according to claim 7, wherein the step of forming a tungsten layer over the semiconductor substrate is carried out using atomic layer deposition (ALD).

9. The method according to claim 7, wherein a tungsten hexafluoride ($WF_6$) gas and a hydrogen gas are used as the source gas, and a diborane ($B_2H_6$) gas is used as the reduction gas.

10. The method according to claim 7, wherein, at the step of exposing the semiconductor substrate to a hydrogen ($H_2$) gas, the hydrogen ($H_2$) gas is introduced into a reaction chamber for forming the tungsten layer, or hydrogen ($H_2$) plasma is formed in the reaction chamber.

11. The method according to claim 7, further comprising:
forming a barrier metal layer in the contact holes, wherein the step of forming a barrier metal layer in the contact holes is carried out before the step of forming a tungsten layer over the semiconductor substrate.

12. The method according to claim 11, wherein the barrier metal layer includes titanium (Ti) or titanium nitride (TiN), or both.

13. The method according to claim 7, wherein the step of forming a tungsten layer over the semiconductor substrate and the step of exposing the semiconductor substrate to a hydrogen (H2) gas are repeatedly carried out several times until the tungsten layer has a predetermined thickness.

14. A method for forming a tungsten layer over a semiconductor substrate, the method comprising:
loading a semiconductor substrate into a reaction chamber;
introducing a tungsten hexafluoride ($WF_6$) gas into the reaction chamber, wherein the tungsten hexafluoride ($WF_6$) is adsorbed over the semiconductor substrate;
introducing a first purge gas into the reaction chamber and purging the tungsten hexafluoride ($WF_6$) which is not adsorbed over the semiconductor substrate;
introducing a diborane ($B_2H_6$) gas into the reaction chamber, wherein at least some of the diborane ($B_2H_6$) gas reacts with the tungsten hexafluoride ($WF_6$) adsorbed over the semiconductor substrate and forms a tungsten layer;
introducing a second purge gas into the reaction chamber and purging the non-reacted diborane ($B_2H_6$) gas;
introducing a hydrogen ($H_2$) gas into the reaction chamber, wherein the boron (B) remaining in the tungsten layer is combined with ionic hydrogen (H); and
introducing a third purge gas into the reaction chamber and purging the combined boron (B) and hydrogen (H).

15. The method according to claim 14, wherein, at the step of introducing a hydrogen ($H_2$) gas into the reaction chamber, hydrogen ($H_2$) plasma is formed in the reaction chamber.

16. A method of forming a tungsten wiring layer of a semiconductor device, the method comprising:
etching an interlayer insulation layer formed over a semiconductor substrate including a lower conductive region to form contact holes, wherein the contact holes partially expose the lower conduction region;
introducing a tungsten hexafluoride ($WF_6$) gas to the semiconductor substrate, wherein at least some of the tungsten hexafluoride ($WF_6$) is adsorbed over a surface of the contact holes;
purging the tungsten hexafluoride ($WF_6$) which is not adsorbed;
introducing a diborane ($B_2H_6$) gas to the semiconductor substrate, wherein at least some of the diborane ($B_2H_6$) gas reacts with the tungsten hexafluoride ($WF_6$) adsorbed over the semiconductor substrate thereby forming a tungsten layer;
purging the non-reacted diborane ($B_2H_6$) gas;
introducing a hydrogen ($H_2$) gas to the semiconductor substrate, wherein the boron (B) remaining in the tungsten layer is combined with ionic hydrogen (H); and
purging the combined boron (B) and hydrogen (H).

17. The method according to claim 16, further comprising:
forming a barrier metal layer in the contact holes, wherein the step of forming a barrier metal layer in the contact holes is performed before the step of forming a tungsten layer over the semiconductor substrate.

18. The method according to claim 17, wherein the barrier metal layer includes titanium (Ti) or titanium nitride (TiN), or both.

19. The method according to claim 16, wherein the step of forming a tungsten layer over the semiconductor substrate and the step of exposing the semiconductor substrate to a hydrogen ($H_2$) gas are repeatedly performed several times until the tungsten layer has a predetermined thickness.

* * * * *